United States Patent
Cho et al.

(10) Patent No.: US 7,405,960 B2
(45) Date of Patent: Jul. 29, 2008

(54) SEMICONDUCTOR MEMORY DEVICE AND METHOD FOR BIASING DUMMY LINE THEREFOR

(75) Inventors: Beak-Hyung Cho, Hwaseong-si (KR);
Hyung-Rok Oh, Hwaseong-si (KR);
Chang-Soo Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/695,232

(22) Filed: Apr. 2, 2007

(65) Prior Publication Data

US 2008/0112208 A1    May 15, 2008

(30) Foreign Application Priority Data

Oct. 31, 2006    (KR)    ............ 10-2006-0106028

(51) Int. Cl.
*G11C 11/00*    (2006.01)
(52) U.S. Cl. .............. 365/148; 365/175; 365/210.1
(58) Field of Classification Search .......... 365/148, 365/158, 171, 175, 200, 210.1
See application file for complete search history.

(56) References Cited

U.S. PATENT DOCUMENTS 6,504,752 B2 * 1/2003 Ito ..................... 365/158
7,215,587 B2 * 5/2007 Lee et al. ............. 365/200
2008/0002457 A1 * 1/2008 Toda et al. ............ 365/148

* cited by examiner

*Primary Examiner*—Gene N. Auduong
(74) *Attorney, Agent, or Firm*—F. Chau & Assoc., LLC

(57) ABSTRACT

A semiconductor memory device and a dummy line biasing method in which in the semiconductor memory device of a diode structure including a plurality of memory cells each having one variable resistance device and one diode device, the memory device includes a plurality of normal word lines, a plurality of normal bit lines, at least one or more dummy word lines and at least one or more dummy bit lines. The plurality of normal word lines are each arrayed in a first direction as a length direction. The plurality of normal bit lines are each arrayed in a second direction as a width direction, intersected with the first direction, so that the plurality of normal bit lines are intersected with the normal word lines. At least one or more dummy word lines are arrayed in the same structure as the normal word lines in the first direction, the at least one or more dummy word lines having a constant level of applied voltage. At least one or more dummy bit lines are arrayed in the same structure as the normal bit lines in the second direction, the at least one or more dummy bit lines being maintained in a floating state. Leakage current in the semiconductor memory device can be reduced, and a production yield can be enhanced.

17 Claims, 3 Drawing Sheets

SEMICONDUCTOR MEMORY DEVICE AND METHOD FOR BIASING DUMMY LINE THEREFOR

This application claims priority under 35 U.S.C. §119 of Korean Patent Application 10-2006-0106028 filed on Oct. 31, 2006, the entire contents of which is hereby incorporated by reference.

TECHNICAL FIELD

The present disclosure relates to semiconductor memory devices and, more particularly, to a semiconductor memory device and a dummy line biasing method therefor that is capable of controlling a dummy line and/or dummy bit line in a memory cell constructed of a variable resistance device and a diode device.

DISCUSSION OF THE RELATED ART

Next-generation memory devices, which are nonvolatile and do not need to be refreshed, have been researched according to a recent requirement for high-capacity and low-power semiconductor memory devices. As the next generation memory devices currently in the spotlight there are a PRAM (Phase-change Random Access Memory) using phase change material, an RRAM (Resistive Random Access Memory) using material having variable properties, such as a transition metal oxide and the like, and an MRAM (Magnetic Random Access Memory) using ferromagnetic material.

In the next generation of memory devices, the PRAM employs phase change material as a storage medium. One such phase change material is a material like chalcogenide, in which resistance is changed by a change of phase based on a temperature change. In general, material such as $Ge_xSb_yTe_z$ (hereinafter, referred to as 'GST') is used as the phase change material, GST being an alloy of Ge (germanium), Sb (antimony) and Te (tellurium).

The phase change material can be successfully used for semiconductor memory devices based on the properties of the material being rapidly changeable into an amorphous state or a crystalline state.

The phase change material has a high resistance in the amorphous state and has a low resistance in the crystalline state, thus the amorphous state may be defined as a reset state RESET or data '1', and the crystalline state may be defined as a set state SET or data '0', or vice versa, in applying the technology to the semiconductor memory devices.

A memory cell constituting the PRAM may be classified into a transistor structure and a diode structure. The transistor structure indicates a memory cell structure in which the phase change material is coupled in series to an access transistor, and the diode structure indicates a memory cell structure in which the phase change material is coupled in series to a diode.

Most semiconductor memory devices including the PRAM include a dummy word line or dummy bit line as well as a dummy cell in a cell array.

In general, the fidelity of a word line or bit line formed on an edge portion of a cell array cannot be guaranteed in view of characteristics of the semiconductor manufacturing process, thus the word line on the edge is designated as a dummy word line and the bit line thereon is designated as a dummy bit line. These dummy word lines or bit lines are excluded from the normal operation of the semiconductor memory device.

FIG. 1 is an equivalent circuit diagram of a memory cell in a PRAM having a transistor structure. FIG. 2 is a circuit diagram illustrating a biasing method of a dummy line in a PRAM having the memory cell shown in FIG. 1.

As shown in FIG. 1, a memory cell 10 is constructed of a variable resistance device R0 formed of phase change material and an NMOS transistor N operating as a switching device.

In the memory cell 10, a gate of the NMOS transistor N is coupled to a word line WL. An upper electrode of the variable resistance device R0 is coupled to a bit line BL, and a lower electrode thereof is connected to a drain of the access transistor N. A source of the transistor N is grounded. Further, in the variable resistance device R0, an upper electrode may be connected to a source of the access transistor N, and a lower electrode may be grounded.

With reference to FIG. 2, in a PRAM using the conventional transistor structure of FIG. 1, a memory cell array 20 includes a plurality of memory cells 10, normal word lines WL0-WLn, normal bit lines BL0-BLm, dummy cells 12, dummy word lines DWL1 and DWL2, and dummy bit lines DBL1 and DBL2. The normal word lines WL0-WLn are controlled by a word line selector 30, and the normal bit lines BL0-BLm are controlled by a bit line selector 40. The word line selector 30 may be a row decoder, and the bit line selector 40 may be a column decoder.

The normal word lines WL0-WLn are arrayed with a given interval in a first direction, such as a length direction.

The normal bit lines BL0-BLm are arrayed with a given interval in a second direction and are intersected with the normal word lines WL0-WLn.

The memory cells 10 are individually disposed at the intersections of the normal bit lines BL0-Blm and the normal word lines WL0-WLn.

The dummy word lines DWL1 and DWL2 are disposed with the same structure in the same direction as the normal word lines WL0-WLn and are located on an edge portion of the cell array 20. The dummy word lines DWL1 and DWL2 are not connected to the word line selector 30, but are connected to a ground line.

The dummy bit lines DBL1 and DBL2 are disposed with the same structure in the same direction as the normal bit lines BL0-BLm, on an edge portion of the cell array 20. The dummy bit lines DBL1 and DBL2 are not connected to the bit line selector 40, but are connected to a ground line.

The dummy cells, one of which is shown at the dashed circuit 12 in FIG. 2, are individually disposed at intersections of the dummy word lines DWL1 and DWL2 and/or the dummy bit lines DBL1 and DBL2.

Generally, the dummy word lines DWL1 and DWL2 and the dummy bit lines DBL1 and DBL2 are disposed on edge portions of a cell array, which is irregular in the structure of memory cells that are arrayed regularly.

As is well known, the dummy word lines DWL1 and DWL2 and the dummy bit lines DBL1 and DBL2 are biased through the ground voltage.

In semiconductor memory devices having a diode structure, however, a biasing for a dummy line including a dummy word line and a dummy bit line becomes a problem in view of a characteristic of the structure.

SUMMARY OF THE INVENTION

Exemplary embodiments of the present invention provide a semiconductor memory device and a method for biasing a dummy line therein that is capable of solving a problem in the conventional art. Leakage current can be reduced, and a production yield can be enhanced.

According to some exemplary embodiments of present the invention, a semiconductor memory device including a plurality of memory cells each constructed of one variable resistance device and one diode device, includes a plurality of normal word lines respectively arrayed in a first direction, such as a length direction; a plurality of normal bit lines respectively arrayed in a second direction, such as a width direction, intersected with the first direction, the plurality of normal bit lines being intersected with the normal word lines; at least one or more dummy word lines arrayed in the same structure as the normal word lines in the first direction, the at least one or more dummy word lines having a constant level of applied voltage; and at least one or more dummy bit lines arrayed in the same structure as the normal bit lines in the second diction, the at least one or more dummy bit lines being kept in a floating state.

The memory cell may be formed on each intersection of the normal word lines and the normal bit lines. A dummy cell having the same structure as the memory cell may be formed at each intersection of the one or more dummy word lines and the normal bit lines, at each intersection of the normal word lines and the one or more dummy bit lines, and at each intersection of the one or more dummy bit lines and the one or more dummy word lines.

A cathode region of the diode device constituting the memory cell or dummy cell may be connected to the normal word line or dummy word line, and an anode region may be coupled to the variable resistance device. A level of voltage applied to the dummy word line may be of a level to maintain a turn-off state of the diode constituting a dummy cell that is connected to the dummy word line.

At least one of the dummy word line and at least one of the dummy bit line may be provided on an edge portion of the memory cell array that includes the normal bit lines, the normal word lines and the memory cells. At least one of the dummy word lines may be spaced apart by predetermined numbers of normal word lines, and at least one of the dummy bit line may be spaced apart by predetermined numbers of normal bit lines.

At least one of the dummy word lines and at least one of the dummy bit lines may be provided on the edge portions of each memory block that includes predetermined numbers of normal word lines and predetermined numbers of normal bit lines.

The semiconductor memory device may be a PRAM in which the variable resistance device is formed of phase change material GST, or an RRAM in which the variable resistance device is formed of a transition metal oxide.

According to some exemplary embodiments of the invention, a method for biasing a dummy line having at least one dummy word line and/or at least one dummy bit line connected with dummy cells, in a semiconductor memory device including memory cells each constructed of one variable resistance device and one diode device and dummy cells having the same structure as the memory cell, includes performing a control so that the dummy bit line maintains a floating state and the dummy word line maintains a constant voltage level regardless of operation of the semiconductor memory device.

A cathode region of the diode constituting the memory cell or dummy cell may be connected to the normal word line or dummy word line, and an anode region thereof may be coupled to the variable resistance device. The voltage applied to the dummy word line may be of a level to maintain a turn-off state of the diode constituting a dummy cell that is connected to the dummy word line.

At least one dummy word line and at least one dummy bit line may be provided on edge portions of the memory cell array that includes the normal bit lines, the normal word lines and the memory cells. Or at least one dummy word line may be disposed spaced apart by predetermined numbers of normal word lines, and at least one dummy bit line may be disposed spaced apart by predetermined numbers of normal bit lines.

At least one dummy word line and at least one dummy bit line may be provided on the edge portions of each memory block that includes predetermined numbers of normal word lines and predetermined numbers of normal bit lines.

In the configuration of the exemplary embodiment of the present invention described above, a leakage current of a semiconductor memory device can be reduced and a production yield can be enhanced.

BRIEF DESCRIPTION OF THE DRAWINGS

Exemplary embodiments of the present invention will be understood in more detail from the following descriptions taken in conjunction with the accompanying drawings in which like reference characters refer to the same parts throughout the different views, in which.

DETAILED DESCRIPTION OF EXEMPLARY EMBODIMENTS

Exemplary embodiments of the present invention now will be described more fully hereinafter with reference to FIGS. 3 and 4, in which the exemplary embodiments of the present invention are shown. This invention may, however, be embodied in many different forms and should not be construed as limited to the exemplary embodiments set forth herein. Rather theses exemplary embodiments are provided so that this disclosure will be thorough and complete, and will fully convey the scope of the invention to those skilled in the art.

Exemplary embodiments of the present invention are more fully described below with reference to FIGS. 3 and 4. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 3:
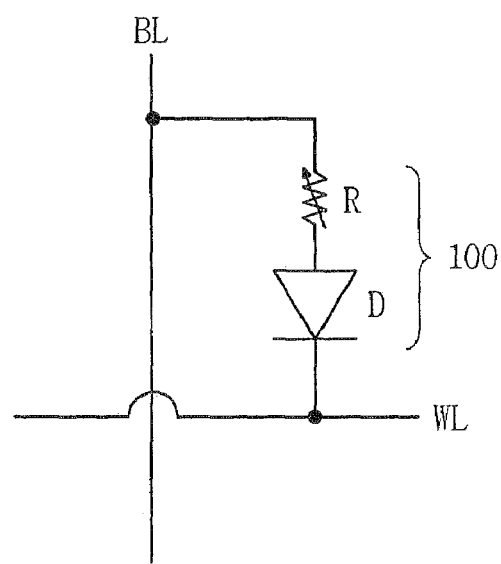
FIG. 3 is an equivalent circuit diagram of a memory cell constituting a semiconductor memory device of a diode structure according to an exemplary embodiment of the present invention.

FIG. 3 illustrates a structure of a memory cell constituting a semiconductor memory device according to an exemplary embodiment of the present invention.

Referring to FIG. 3, a semiconductor memory deice according to an exemplary embodiment of the present invention is a semiconductor memory device having a memory cell 100 formed of a diode structure. The memory cell 100 includes a variable resistance device R and a diode device D.

A semiconductor memory device according to exemplary embodiments of the present invention may be classified as PRAM, RRAM, MRAM and the like according to the sort of variable resistance device R being used. When the variable resistance device R is formed of phase change material GST and so a resistance is changed according to temperature, the semiconductor memory device may be a PRAM. When the variable resistance device R is formed of a transistor metal oxide, it may be an RRAM. When the variable resistance device R is comprised of upper and lower electrodes formed of magnetic material with insulation material between them, it may be an MRAM. Thus, the kind of semiconductor memory device in an exemplary embodiment of the present invention may become different according to the material of the variable resistance derive R. A configuration of a PRAM as an exemplary embodiment of the present invention will be described herein as follows.

As shown in FIG. 3, in the PRAM a memory cell 100 is constructed of one diode D and one variable resistance device R. The variable resistance device R is formed of phase change material as described above.

The diode D constituting the memory call 100 is connected between a word line WL and the variable resistance device R, in which a cathode terminal is coupled to the word line WL and an anode terminal is coupled to one end of the variable resistance device R. Another end of the variable resistance device R is connected to a bit line BL.

Figure 1:
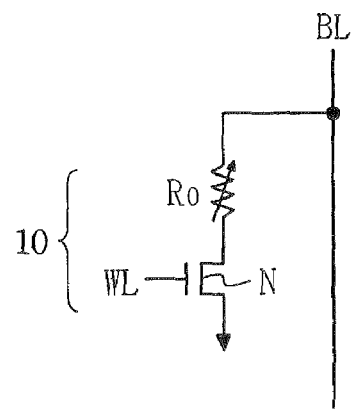
FIG. 1 is an equivalent circuit diagram of a memory cell in a semiconductor memory device having a known transistor structure.

As compared with the PRAM employing the transistor structure shown in FIG. 1, the PRAM employing the diode structure has the advantages of allowing a large write current, which exponentially increases according to an applied voltage, to flow therein and of deviating from a limitation in the transistor size and so providing flexibility in a reduction of memory cell and overall chip size. Thus, demands for PRAMs including memory cells having the diode structure, among semiconductor memory devices requiring a high degree of integration, a high speed, and low power consumption, are increasing.

In a semiconductor memory device employing a memory cell having the structure described above, the variable resistance device R is used as a storage element for data, and a write operation is performed by using a reversible characteristic of the variable resistance deice R based on a magnitude of current or voltage applied to a memory cell through the bit line BL. In performing the write operation to the memory cell 100, current is supplied through the bit line BL, and the word line WL is transitioned to a low level or ground level, and so a forward bias is applied to the diode D, then a current path is formed from the bit line BL to the word line WL. At this time, the variable resistance device R connected to an anode terminal of the diode D has a phase change, and so becomes either a 'set' state of a low resistance or a 'reset' state of a high resistance.

In the meantime, in a read operation, data is decided according to the amount of current flowing through the memory cell 100, according to a 'set' or 'reset' state of the memory cell. When the variable resistance device R of the memory cell 100 has a 'reset' state, the memory cell has a high resistance value and a small quantity of current flows from bit line BL having a constant level and when, as opposed to that state, the memory cell has a low resistance value, a relatively large amount of current flows.

Figure 4:
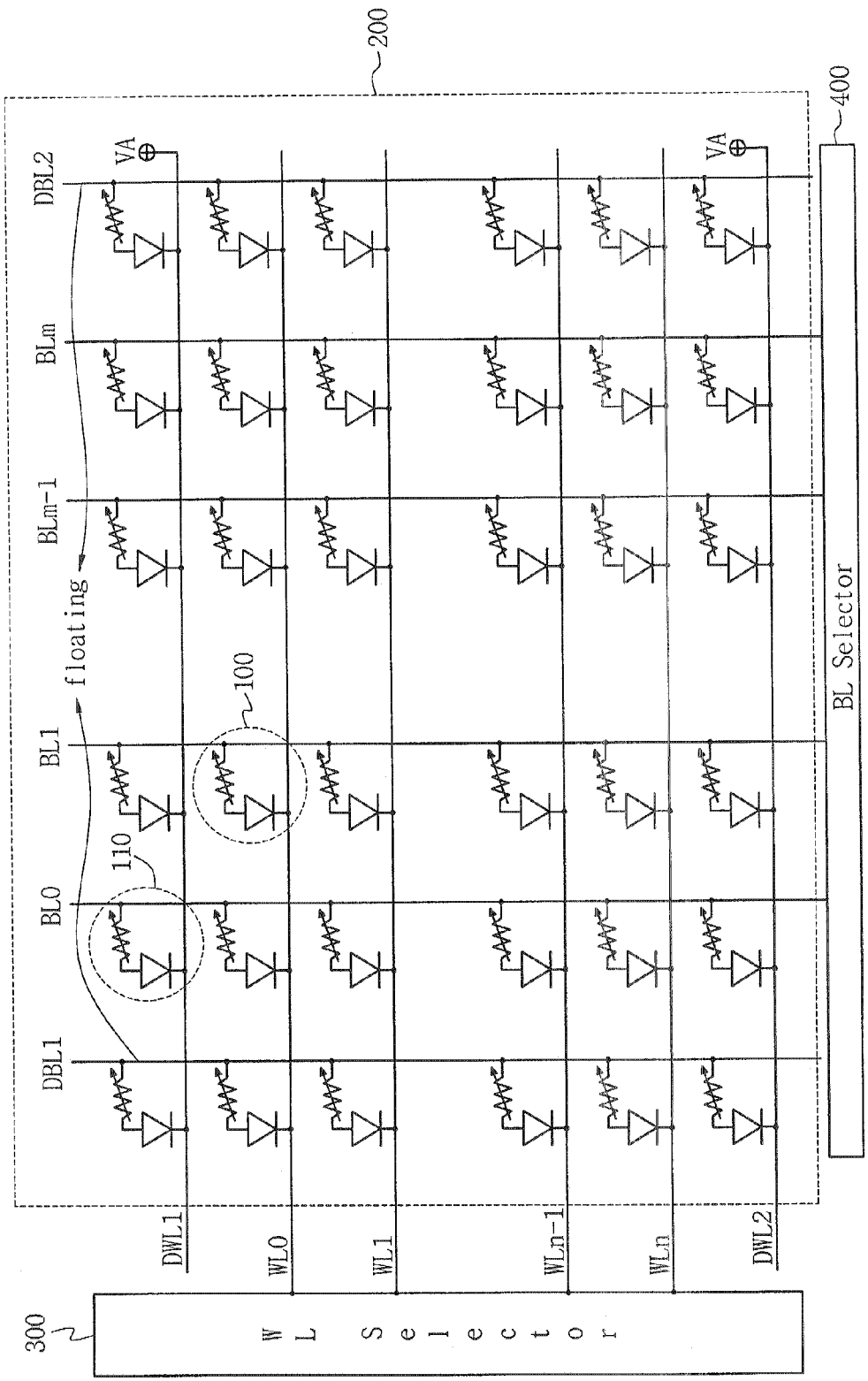
FIG. 4 illustrates a semiconductor memory device having a memory cell shown in FIG. 3 according to an exemplary embodiment of the present invention.

FIG. 4 illustrates a dummy line biasing method of a semiconductor memory device according to an exemplary embodiment of the present invention having the memory cell structure of FIG. 3.

As shown in FIG. 4, a semiconductor memory device of a diode structure includes a plurality of memory cells, one of which is shown by the dashed-line circle 100, normal word lines WL0-WLn, normal bit lines BL0-BLm, dummy cells, one of which is shown by the dashed-line circuit 110, dummy word lines DWL1 and DLW2 and dummy bit lines DBL1 and DBL2.

One of the memory cells 100 is disposed at each intersection of the normal word lines WL0-WLn and normal bit lines BL0-BLm. As described above, the memory cell 100 has a diode structure shown in FIG. 3.

The normal word lines WL0-WLn are arrayed with a given interval in a first direction, such as a length direction of the word line. Each of the normal word lines WL0-WLn has a connection structure to the diode device D constituting the memory cell 100.

The normal word lines WL0-WLn are controlled by a word line selector 300. The word line selector may be a row decoder circuit.

The normal bit lines BL0-BLm are arrayed with a given interval in a second direction intersected with the normal word lines WL0-WLn. Each of the normal bit lines BL0-BLm has a structure coupled to the variable resistance device R constituting the memory cell 100.

The normal bit lines BL0-BLm are controlled by a bit line selector 400. The bit line selector 400 may be a column decoder circuit.

The dummy word lines DWL1 and DWL2 are disposed on edge portions of the cell array 200 with the same structure and in the same direction as the normal word lines WL0-WLn. The dummy word lines DWL1 and DWL2 are not coupled to the word line selector 300, but are connected to a voltage line having an optional level. The dummy word lines have a voltage VA of a constant level that is always applied regardless of the operation of the semiconductor memory device. At least one of the dummy word lines DWL1 and DWL2 may be provided on the edge portion of the memory cell array 200. Also, at least one of the dummy word lines DWL1 and DWL2 may be disposed spaced apart by predetermined numbers of the normal word lines WL0-WLn.

The voltage level VA applied to the dummy word lines DWL1 and DWL2 may be a voltage level sufficient to maintain a turn-off state of the diode constituting a dummy cell 110 that is coupled to the dummy word lines DWL1 and DWL2. When the diode constituting the dummy cell 110 is turned on, it is in a state in which a leakage current may flow.

The dummy bit lines DBL1 and DBL2 are disposed on edge portions of the cell array 200, with the same structure and in the same direction as the normal bit lines BL0-BLm. The dummy bit lines DBL1 and DBL2 are not connected to the bit line selector 400, and are maintained in floating state. At least one of the dummy bit lines DBL1 and DBL2 may be provided on the edge portion. At least one of the dummy bit lines DBL1 and DBL2 may be disposed spaced apart by predetermined numbers of normal bit lines BL0-BLm.

The dummy bit lines DBL1 and DBL2 maintain a floating state, to cut off a path of leakage current that may flow from a selected word line WL or unselected normal word line WL to its connected dummy bit line DBL through the memory cell 100. Further, there is an advantage of being repairable an unexpected defect, such as a short-circuiting, without an additional current path.

Figure 2:
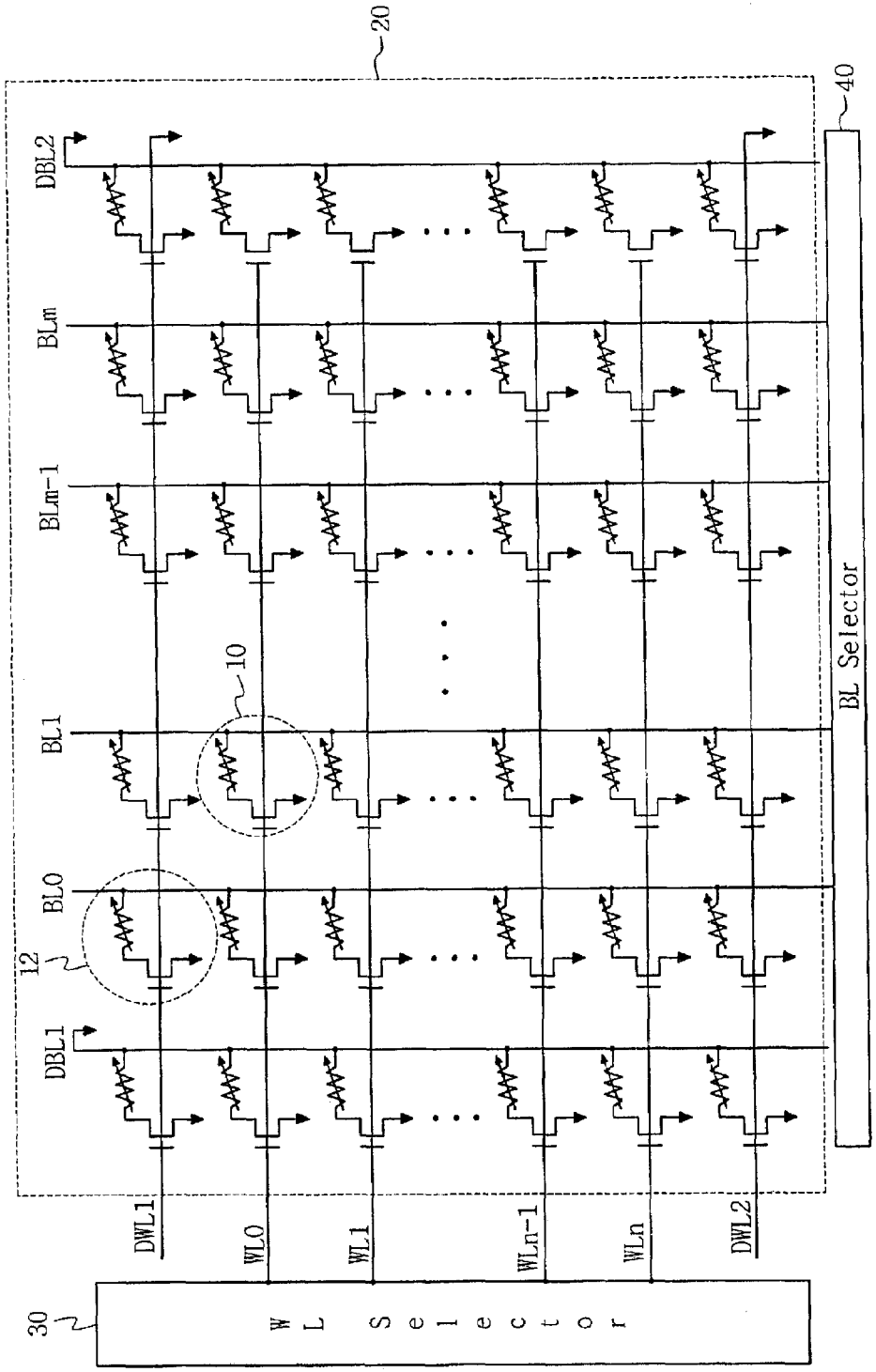
FIG. 2 illustrates a known semiconductor memory device of a transistor structure including a memory cell shown in FIG. 1.

If the dummy bit lines DBL1 and DBL2 are maintained in the grounded state, like in the conventional art of FIG. 2, leakage current continuously flows from the normal word line WL to the dummy bit line DBL, regardless of the repair of a defective cell, thereby causing a reduction in production yield.

The dummy cells 110 are individually disposed on each intersection of the dummy word lines DWL1 and DWL2 and/or the dummy bit lines DBL1 and DBL2. That is, the dummy cells 110 are individually disposed on each intersection of the dummy word lines DWL1 and DWL2 and the normal bit lines BL0-BLm, of the normal word lines WL0-WLn and the dummy bit lines DBL1 and DBL2, and of the dummy bit lines DBL1 and DBL2 and the dummy word lines DWL1 and DWL2. The dummy cells 110 have the same structure as the memory cells 100.

The dummy word lines DWL1 and DWL2 and the dummy bit lines DBL1 and DBL2 are generally disposed on edge portions of the cell array, which is irregular in the structure of memory cells arrayed regularly. According to a tendency to a high integration, however, at least one of the dummy bit lines DBL and at least one of the dummy word lines DWL may be disposed in each sub array block having predetermined numbers of memory cells as a unit. In other words, at least one of the dummy bit lines DBL and at least one of the dummy word lines DWL may be disposed on the portion that breaks a regularity of the array of a plurality of memory cells.

In the semiconductor memory device, when a memory cell is selected for a read or write operation, a normal word line WL connected to the selected memory cell transitions to a ground level, and a specific voltage VB (not shown) is applied to a normal bit line BL coupled to the selected memory cell. A level of the specific voltage VB applied to the normal bit line BL may be a voltage level higher than a threshold voltage Vth of the diode device D of the memory cell 100, that is, a voltage level sufficient to turn on the diode device D.

The voltage of unselected normal bit lines BL is discharged to a ground level, and a voltage VA having a level higher than 'VB-Vth' is applied to unselected normal word lines WL, so that diode device D of a memory cell coupled to the normal word lines WL is turned off.

A constant level of voltage VA is always applied to the dummy word lines DWL1 and DWL2 regardless of operation of the semiconductor memory device, and the dummy bit lines DBL1 and DBL2 are maintained in a floating state.

The voltage level VA applied to the unselected normal word lines WL may be the same as the voltage level VA applied to the dummy word lines DWL1 and DWL2.

As described above, in a semiconductor memory device of a diode structure including dummy word lines DWL1 and DWL2 and dummy bit lines DBL1 and DBL2, a constant level of voltage is applied to the dummy word lines DWL1 and DWL2 regardless of the operation of the semiconductor memory device, and the dummy bit lines DBL1 and DBL2 mainatin a floating state, thereby reducing leakage current and enhancing a producing yield.

As described above, according to exemplary embodiments of the present invention, in a semiconductor memory device of a diode structure including at least one or more dummy word lines DWL1 and DWL2 and/or at least one or more dummy bit lines, a constant level of voltage is applied to the dummy word lines regardless of operation of the semiconductor memory device, and the dummy bit lines keep a floating state, thereby reducing leakage current and enhancing a production yield.

It will be apparent to those of ordinary skill in the art that modifications and variations can be made in the exemplary embodiments of the present invention without deviating from the spirit or scope of the present invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed exemplary embodiments of the present invention and, although specific terms are employed, they are used in a generic and descriptive sense only and not for purposes of limitation, the scope of the invention being set forth in the following claims.

What is claimed is:

1. A semiconductor memory device of a diode structure including a plurality of memory cells each having one variable resistance device and one diode device, the memory device comprising:

a plurality of normal word lines each arrayed in a first direction as a length direction;

a plurality of normal bit lines each arranged in a second direction as a width direction intersected with the first direction, wherein the plurality of normal bit lines intersect with the plurality of normal word lines;

one or more dummy word lines arrayed in the same structure as the normal word lines in the first direction, the one or more dummy word lines having a constant level of applied voltage; and one or more dummy bit lines arrayed in the same structure as the normal bit lines in the second direction, the one or more dummy bit lines being maintained in a floating state.

2. The memory device of claim 1, wherein one of the plurality of memory cells is formed at each intersection of the plurality of normal word lines and the plurality of normal bit lines, and a dummy cell having the same structure as the memory cell is formed at each intersection of the one or more dummy word lines and the plurality of normal bit lines, at each intersection of the plurality of normal word lines and the one or more dummy bit lines, and at each intersection of the one or more dummy bit lines and the one or more dummy word lines.

3. The memory device of claim 2, wherein a cathode region of the diode device constituting the memory cell or the dummy cell is coupled to the normal word line or the dummy word line, and an anode region thereof is coupled to the variable resistance device.

4. The memory device of claim 3, wherein a voltage applied to the dummy word line has a level sufficient to maintain a turn-off state of the diode device constituting the dummy cell coupled to the dummy word line.

5. The memory device of claim 4, wherein at least one of the dummy word line and at least one of the dummy bit line are formed on edge portions of the memory cell array having the plurality of normal bit lines, the plurality of normal word lines and the plurality of memory cells.

6. The memory device of claim 4, wherein at least one dummy word line is disposed spaced apart by predetermined numbers of normal word lines, and at least one dummy bit line is disposed spaced apart by predetermined numbers of normal bit lines.

7. The memory device of claim 4, wherein at least one dummy word line and at least one dummy bit line are formed on edge portions of each block of memory cells including a predetermined number of the plurality of normal word lines and a predetermined number of the plurality of normal bit lines.

8. The memory device of claim 4, wherein the semiconductor memory device is a PRAM(Phase-change Random Access Memory) in which the variable resistance device is formed of phase change material GST ($Ge_xSb_yTe_z$).

9. The memory device of claim 4, wherein the semiconductor memory device is a RRAM (Resistive Random Access Memory) in which the variable resistance device is formed of a transistor metal oxide.

10. A method for biasing dummy lines having at least one dummy word line and/or at least one dummy bit line coupled with dummy cells, in a semiconductor memory device including memory cells each having one variable resistance device and one diode device and dummy cells having the same structure as the memory cell, the method comprising:

performing a control of maintaining a floating state of the dummy bit line and maintaining a constant voltage level of the dummy word line regardless of operation of the semiconductor memory device.

11. The method of claim 10, wherein a cathode region of the diode device constituting the memory cell or dummy cell is coupled to the normal word line or to the dummy word line, and an anode region of the diode device is coupled to the variable resistance device.

12. The method of claim 11, wherein a voltage applied to the dummy word line has a level sufficient to maintain a turn-off state of the diode device constituting a dummy cell coupled to the dummy word line.

13. The method of claim 12, wherein at least one dummy word line and at least one dummy bit line are formed on edge portions of a memory cell array including the normal bit lines, the normal word lines, and the memory cells.

14. The method of claim 12, wherein at least one dummy word line is disposed spaced apart by predetermined numbers of normal word lines, and at least one dummy bit line is disposed spaced apart by predetermined numbers of normal bit lines.

15. The method of claim 12, wherein at least one dummy word line and at least one dummy bit line is formed on edge portions of each memory block including predetermined numbers of normal word lines and predetermined numbers of normal bit lines.

16. The method of claim 12, wherein the semiconductor memory device is a PRAM (Phase-change Random Access Memory) in which the variable resistance device is formed of phase change material GST ($Ge_xSb_yTe_z$).

17. The method of claim 12, wherein the semiconductor memory device is a RRAM (Resistive Random Access Memory) in which the variable resistance device is formed of a transition metal oxide.

* * * * *